United States Patent
Wu et al.

[19]

[11] Patent Number: 6,148,388
[45] Date of Patent: Nov. 14, 2000

[54] EXTENDED PAGE MODE WITH MEMORY ADDRESS TRANSLATION USING A LINEAR SHIFT REGISTER

[75] Inventors: Frank Yuhhaw Wu, Fremont; Steven K. Feng, Cupertino, both of Calif.

[73] Assignee: Seagate Technology, Inc., Scotts Valley, Calif.

[21] Appl. No.: 09/007,621

[22] Filed: Jan. 15, 1998

Related U.S. Application Data

[60] Provisional application No. 60/053,437, Jul. 22, 1997.

[51] Int. Cl.$^7$ ............................................. G06F 12/06
[52] U.S. Cl. ........................................ 711/217; 711/219
[58] Field of Search ................................ 711/217, 218, 711/219, 220

[56] References Cited

U.S. PATENT DOCUMENTS

| | | | |
|---|---|---|---|
| 5,280,601 | 1/1994 | Desai et al. ................................ | 711/5 |
| 5,379,410 | 1/1995 | Okada ........................................ | 714/8 |
| 5,572,682 | 11/1996 | Garibay, Jr. et al. ............... | 711/219 X |
| 5,587,964 | 12/1996 | Rosich et al. ......................... | 365/238.5 |
| 5,652,860 | 7/1997 | Sato ....................................... | 711/154 |
| 5,675,770 | 10/1997 | Ogata ...................................... | 711/173 |
| 5,687,341 | 11/1997 | Ducateau ............................ | 711/219 X |
| 5,765,181 | 6/1998 | Oberlin et al. ...................... | 711/219 X |
| 5,784,700 | 7/1998 | Chen et al. .......................... | 711/219 X |

*Primary Examiner*—David L. Robertson
*Attorney, Agent, or Firm*—Merchant & Gould P.C.

[57] ABSTRACT

The present disclosure concerns a method and apparatus for accessing a memory device, such as a dynamic random access memory (DRAM). The DRAM has a plurality of rows, wherein each row has a plurality of DRAM paragraphs comprised of a plurality of contiguous columns. A linear shift register (LSR) translates a plurality of logical addresses to corresponding physical address locations in the DRAM. Each translated physical address is comprised of a row address and a column address. A physical address, including the row and column addresses, is accessed from the LSR. To access the DRAM paragraph at the accessed physical address, the row in the DRAM at the accessed row address location is strobed to setup and precharge the row. Following, all columns in the DRAM paragraph at the accessed physical address are strobed. After strobing the columns in a DRAM paragraph, the next physical address in the LSR, including the next row and column addresses, is accessed. The row in the DRAM at the next accessed row address is strobed to setup and precharge the row upon determining that the next row address is different than the previously accessed row address. Regardless of whether the next accessed row address is strobed or whether the previous precharge and setup is maintained, all columns in the DRAM paragraph at the accessed physical address are strobed.

25 Claims, 4 Drawing Sheets

FIG. 5

EXTENDED PAGE MODE WITH MEMORY ADDRESS TRANSLATION USING A LINEAR SHIFT REGISTER

CROSS-REFERENCE TO RELATED APPLICATIONS

This application claims the benefit under 35 U.S.C. § 119(e) of U.S. Provisional application Ser. No. 60/053,437, filed Jul. 22, 1997 for an "Extended Page Mode With an LSR Converted Addressing for Embedded LRC Scheme," by Frank Yuhhaw Wu and Steven K. Peng, which application is also hereby incorporated by reference in its entirety.

This application is related to the co-pending and commonly-assigned Application Ser. No. 09/007,618, filed on same date herewith, by Frank Yuhhaw Wu and Steven K. Peng, entitled "Extended Page Mode With a Skipped Logical Addressing for Embedded Longitudinal Redundancy Check Scheme," attorney's docket number 30874.05-US-U1.

BACKGROUND OF THE INVENTION

1. Field of the Invention

The present invention relates generally to a method and apparatus for accessing a memory device and, in preferred embodiments, a method and apparatus which utilizes a linear shift register (LSR) to translate logical addresses to physical addresses to be accessed in a dynamic random access memory (DRAM).

2. Description of Related Art

Volatile storage devices, such as dynamic random access memories (DRAMs), are often used with magnetic storage media to provide buffer memory to temporarily store character information. When other devices, such as non-volatile storage media, access the DRAM, they present logical addresses representing locations in the DRAM where a selected read or write operation will be performed. These logical addresses must be translated to corresponding physical addresses in the DRAM, which are used when performing read/write operations.

Typically, an error checking method is used to detect possible corruption of data stored in the DRAM. One such error checking method involves adding a parity code to each block of data written to the DRAM. This parity code is later used to detect errors in the block of data when it is read out from the DRAM. However, adding a parity code to a block of data in the DRAM complicates the positioning of the data within the DRAM because the parity code interrupts the contiguous storage of data in the DRAM.

Moreover, a system must be provided to map the logical memory address to a physical address in the DRAM. Various methods for translating a logical to a physical address are known in the art, such as the translation methods disclosed in U.S. Pat. No. 5,280,601, entitled "Buffer Memory Control System for a Magnetic Disc Controller," to Dhiru N. Desai et al., assigned to Seagate Technology, Inc., the assignee of the subject application and U.S. Pat. No. 5,652,860, entitled "Memory Control Device," to Fumiki Sato, which patents are incorporated by reference herein in their entirety. Prior art translation techniques often involve the use of page tables to map the logical address to the physical address. However, page table techniques often noticeably increase DRAM access time.

SUMMARY OF THE DISCLOSURE

To address the shortcomings in the prior art described above, preferred embodiments of the present invention provide a memory device having a plurality of row locations, wherein each row has a plurality of paragraph locations comprised of a plurality of contiguous columns. A linear shift register (LSR) translates a plurality of logical addresses to corresponding physical address locations in the memory device. Each translated physical address is comprised of a row address and a column address. The translated physical address locations in the memory device are then accessed.

In further embodiments, to access a paragraph location in the memory device, a physical address, including the row and column addresses, is accessed from the LSR. The row location is then strobed at the accessed row address location to setup and precharge the row. Following, all columns in the paragraph location at the accessed physical address are strobed. After strobing the columns in a paragraph location, the next physical address in the LSR, including next row and column addresses, is accessed. The row location at the next row address is strobed to setup and precharge the row upon determining that the next row address is different than the previously accessed row address. All columns in the paragraph location at the next physical address are strobed.

In yet further embodiments, data may be read from the strobed columns. Alternatively, data within a data paragraph associated with the physical address may be written to the strobed column.

It is an object of preferred embodiments of the present invention to reduce the clock cycles needed to access a memory device, such as a DRAM, and increase the buffer bandwidth of the memory device without having to increase the memory device clock speed.

It is a further object of preferred embodiments to translate all logical addresses to physical addresses prior to memory access operations or in parallel with other operations such that the translation process will have a negligible effect on memory access time.

BRIEF DESCRIPTION OF DRAWINGS

Referring now to the drawings in which like reference numbers represent corresponding parts throughout.

DETAILED DESCRIPTION OF PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

The Structure and Hardware Environment of the DRAM

Figure 1:
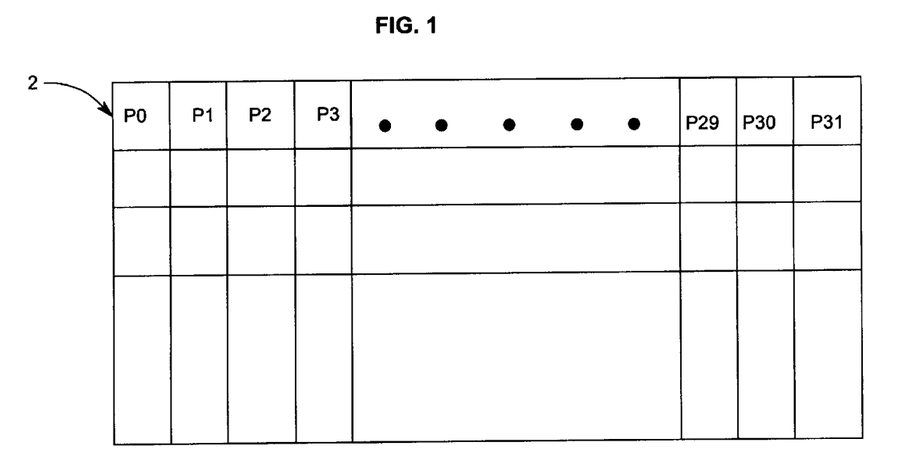
FIG. 1 illustrates an arrangement of data in a DRAM in accordance with a preferred embodiment of the present invention.

FIG. 1 illustrates an arrangement of data in accordance with a preferred embodiment of an extended page mode DRAM 2. In this extended page mode embodiment, data is stored in thirty-two paragraph blocks, P0 through P31. Each paragraph (P) is comprised of sixty-four bytes (16×32 bits) stored in sixteen columns. In preferred embodiments, paragraphs P0 through P29 contiguously store data and paragraphs P30 and P31 store parity codes for the paragraphs P0–P29. For instance, the first column in P30 would store the parity code for P0, the second column in P30 would store the parity code for P1, up until the last column in P30 which stores the parity code for P15. The first column in P31 stores the parity code for P16, the second column in P31 stores the parity code for P17, up until the fourteenth column in P31 which stores the parity code for P29. In preferred embodiments, data is written to all the columns in a row before writing data to the next row.

Figure 2:
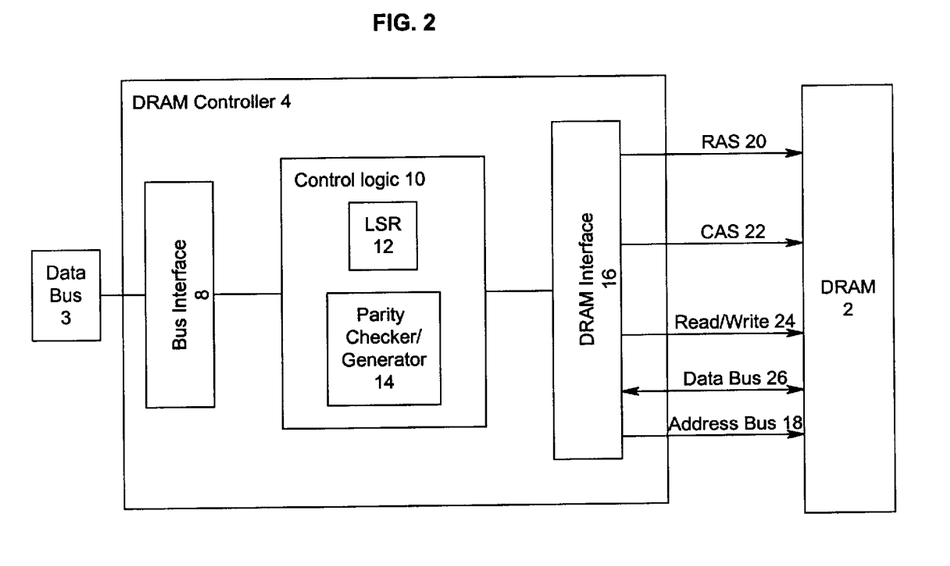
FIG. 2 is a block diagram illustrating an exemplary hardware environment used to implement a preferred embodiment of the invention.

FIG. 2 illustrates a preferred embodiment of a hardware environment for accessing the DRAM 2. A data bus 3 provides bus communication between a DRAM controller 4 and other input/output devices (not shown). The DRAM controller 4 interfaces between the data bus 3 and the DRAM 2 to control the flow of data therebetween. The DRAM controller 4 includes various logic components, including a bus interface 8, control logic 10, which further includes a linear shift register (LSR) 12 and a parity checker/generator 14, and a DRAM interface 16.

The data bus 3 communicates a request to access the DRAM 2. Such request would include the logical addresses of locations in the DRAM to access, control signals indicating whether the request involves a read or write operation, and data paragraphs to be written in the DRAM if the request is a write request. In further embodiments there may be multiple busses, such as busses to provide host data from a SCSI or IDE peripheral storage device, formatted data from a formatter, and read/write requests from a microprocessor.

The bus interface 8 includes logic to control the flow of data from the data bus 3 to the DRAM 2. The bus interface 8 would include arbitration logic to assign priority to requests presented from the data bus 3 or multiple data buses 3 in order to insure there is only one access to the DRAM 2 at a time. For instance, the following requests are listed in order from highest to lowest priority rank: a request from a magnetic disc to write formatted data to the DRAM 2; a request to refresh the DRAM 2; a request to write data from a SCSI device; and a read/write request from a microprocessor. A bus structure including multiple busses coupled to a DRAM controller to access a DRAM is discussed in U.S. Pat. No. 5,280,601, entitled "Buffer Memory Control System for a Magnetic Disc Controller," to Dhiru N. Desai et al., which was incorporated by reference in its entirety above.

The control logic 10 includes the LSR 12 and the parity checker/generator 14. The control logic also performs other Direct Memory Access (DMA) operations to transfer data between the DRAM 2 and the data bus 3. The LSR 12 translates the logical addresses received from the data bus 3 via the bus interface 8 and generates physical addresses of the actual locations in the DRAM 2. In preferred embodiments, the logic of the LSR 12 is expressed as a polynomial equation which is the divisor in a division operation wherein the logical address is the dividend. The result of this division operation is the translated physical address. For a 256 K and 512 K DRAM, the logic equation to implement the LSR 12 is the polynomial: $x^4+x^3+x^2+x$. For a 1 Mb DRAM, the logic equation to implement the LSR 12 is the polynomial: $x^5+x^4+x^3+x^2$. Those skilled in the art will recognize that alternative logic equations can be used to implement the LSR 12. In preferred embodiments, the LSR 12 translates logical to physical addresses at the beginning of cluster transfer, wherein each cluster consists of a series of sectors. By performing translation prior to DRAM access time, the LSR 12 performs it conversion activities with negligible effects on DRAM access time. Those skilled in the art will appreciate that the LSR 12 translation may occur in parallel during other operations, such as setting up registers for data transfer. The translated addresses are stored in the LSR 12. The LSR 12 translation method should take on average seven clock cycles when a 50 MHz DRAM clock is used, and no longer than 14 clock cycles. In this way, the overhead for the address translation is relatively small or undetectable.

The parity checker/generator 14 includes logic to perform parity operations. When a write request is made, the parity checker/generator 14 receives as input each data paragraph to be stored in the DRAM 2. The parity checker/generator 14 generates a parity code for each data paragraph in a manner discussed below. When a read request is made, the parity checker/generator 14 checks the data paragraphs read from the DRAM 2 with the corresponding parity codes stored in the DRAM 2. In preferred embodiments, the parity checker/generator 14 employs the longitudinal redundancy check method (LRC). The parity/checker generator 14 may also include an error correcting code (ECC) system to correct data errors in the data paragraphs.

The DRAM interface 16 controls communication with the DRAM 2. The DRAM interface 16 receives the physical address to be accessed from the LSR 12, including a row and column portion. To access the row in the DRAM 2, the DRAM interface 16 outputs the row address on address bus 18 and strobes the row location supplied on the address bus 18 with a row access strobe (RAS) signal line 20. To access a column address in the DRAM 2, the DRAM interface 16 outputs the column address on the address bus 18 and strobes the column location at the column address supplied on the address bus 18 with a column access strobe (CAS) signal line 22. The DRAM interface 16 further outputs a read/write (R/W) signal 24 indicating whether data is to be written or read from the accessed location. Data is transferred between the DRAM interface 16 and DRAM 2 via a DRAM data bus 26.

In preferred embodiments involving an EDO or page mode DRAM, the DRAM interface 16 further includes address generation logic to generate the physical column addresses within the paragraph at the accessed physical address. After the DRAM interface 16 strobes the first column within the paragraph, the address generator increments a counter indicating that a column within the paragraph has been strobed. This counter is used to generate the next column address within the paragraph. The DRAM interface 16 uses these generated column addresses to sequentially strobe all the columns within the paragraph. Those skilled in the art will recognize that alternative means may be used to strobe each column within an accessed paragraph.

Figure 3:
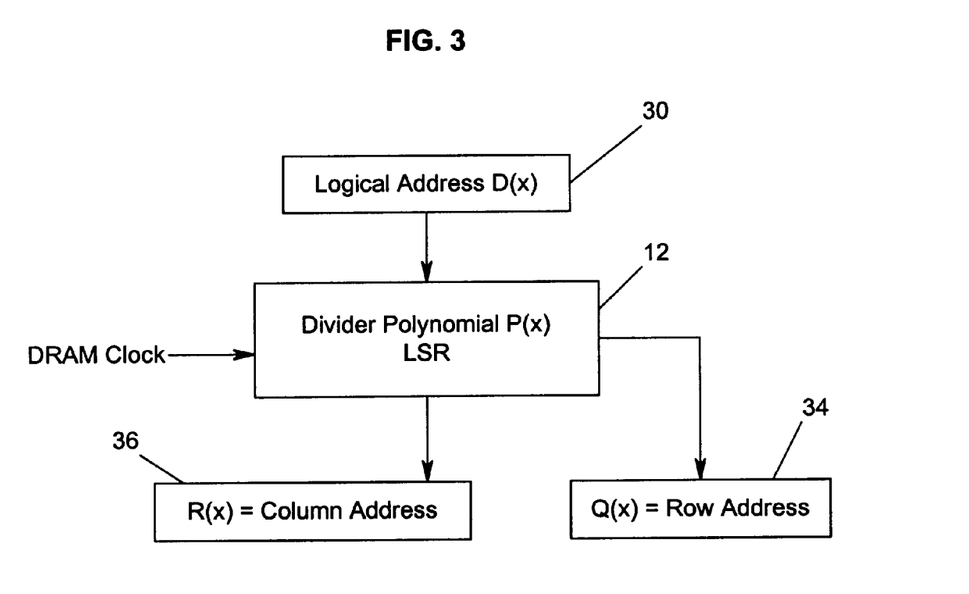
FIG. 3 is a block diagram illustrating an implementation of the logic for converting a logical address to a physical address in accordance with a preferred embodiment of the present invention.

FIG. 3 is a block diagram of a VHDL implementation of the LSR 12 that translates logical addresses to corresponding physical addresses in the DRAM 2. The LSR 12 receives as input a logical address 30 D(x) to be converted. As mentioned, in preferred embodiments, the LSR 12 is represented as the fixed divider polynomial P(x), wherein for a 256 K or 512 K DRAM, P(x) $x^4+x^3+x^2+x$ and for a 1 Mb DRAM, P(x) $x^5+x^4+x^3+x^2$. The logical address D(x) 30 is driven through the LSR 12 which performs a division operation on the logical address 30 using the divider polynomial P(x) as described in the above logic equations. A quotient Q(x) 34 from this division operation, wherein Q(x)=D(x)/P(x), is the physical row address 32 in the DRAM. A remainder R(x) 36 from this division operation is the physical column address 34.

Those skilled in the art will recognize that the exemplary design of the DRAM controller 4 and the logic components therein, and the extended page mode structure of the DRAM 2 shown in FIG. 1 are not intended to limit the present invention. Indeed, those skilled in the art will recognize that alternative design arrangements for the DRAM controller 4, and components thereof, and the paragraph structure shown in FIG. 1 may be used without departing from the scope of the present invention.

Reading and Writing to the DRAM

Figure 4:
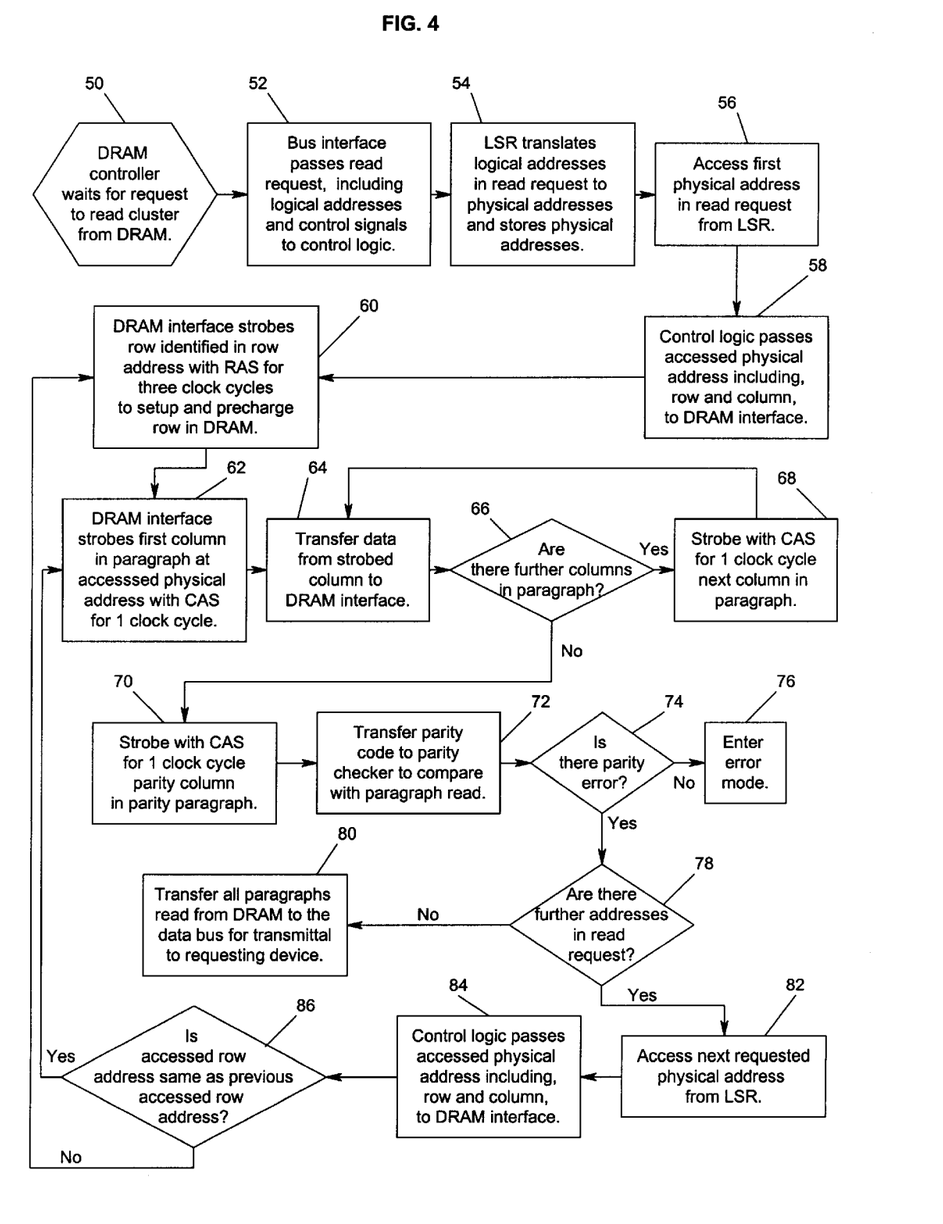
FIG. 4 is a flowchart that illustrates general logic used to read data from a DRAM in accordance with a preferred embodiment of the present invention.
Figure 5:
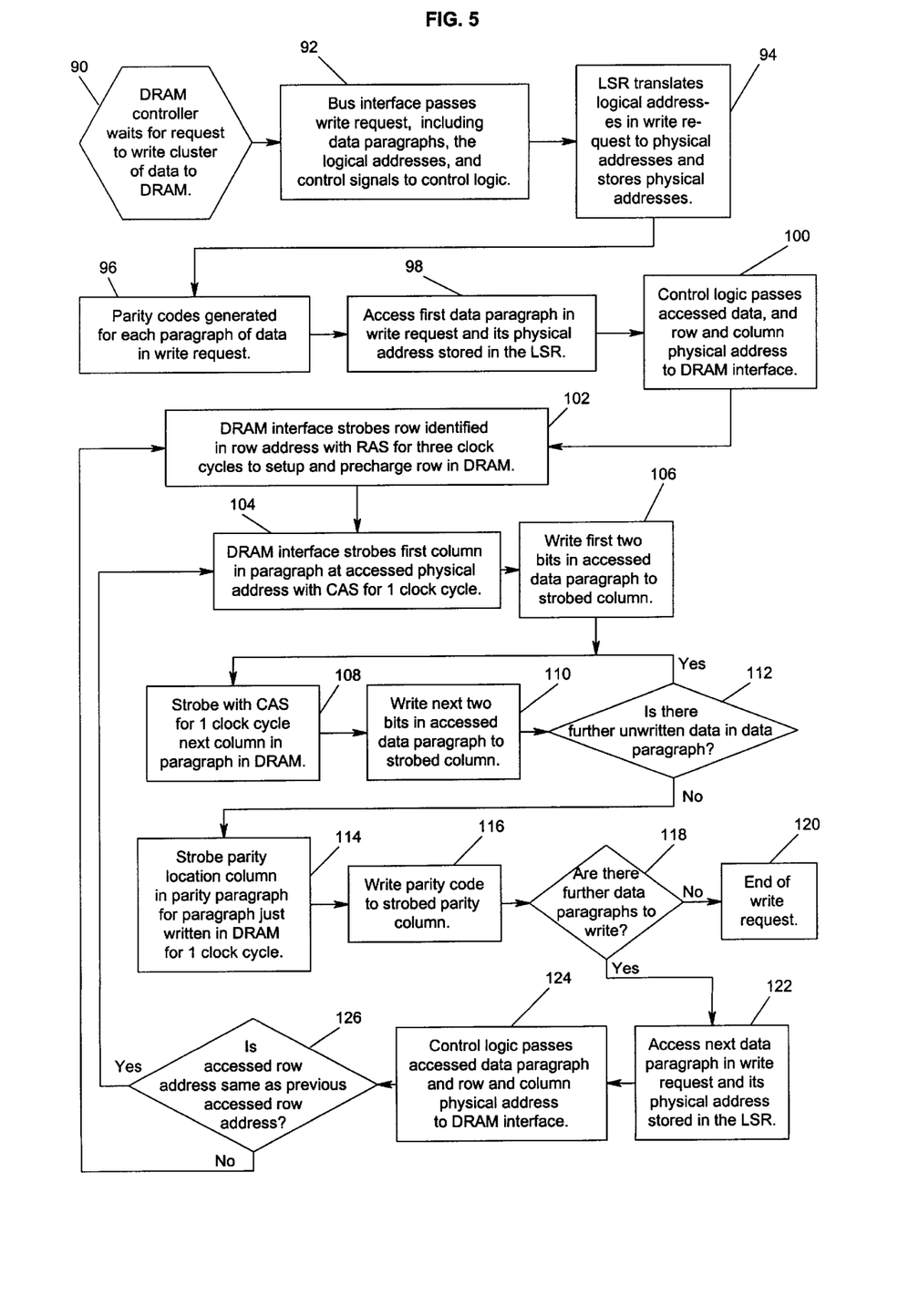
FIG. 5 is a flowchart that illustrates general logic used to write data to a DRAM in accordance with a preferred embodiment of the present invention.

FIGS. 4 and 5 are flowcharts illustrating an embodiment of the logic used to read and write to the DRAM 2, respectively. Such logic may be implemented in the firmware of the DRAM controller 4 or as hardware logic (e.g., circuits and gates) in the DRAM controller 4. Those skilled in the art will recognize that this logic is provided for illustrative purposes only and that different logic may be used to accomplish the same results.

FIG. 4 illustrates an embodiment of logic for reading sequential blocks of data, such as a cluster or sector from the DRAM 2, in response to a read request transmitted via the data bus 3. A read request could also come from some other source. For instance, the DRAM control logic 10 could generate a read/write request when generating a refresh signal to refresh the DRAM 2. In preferred embodiments, the logic of FIG. 4 is used to read data from the DRAM 2 of FIG. 1, wherein data is stored contiguously in a row in paragraphs 0 through 29, interrupted only by the parity paragraphs 30 and 31 at the end of each row.

At block 50, the DRAM controller 4 waits for a request to read a cluster of data transmitted from the data bus 3. Control transfers to block 52 which represents the bus interface 8 passing the read request, including the logical addresses to be read and control signals, to control logic 10. Control then transfers to block 54 which represents the LSR 12 translating the logical addresses included in the read request to physical addresses and storing the physical addresses.

Control then transfers to block 56 which represents the DRAM interface 16 accessing the first physical address in the read request from the LSR 12. Control transfers to block 58 which represents the control logic 10 transferring the accessed physical address, including the row and column addresses, to the DRAM interface 16. From there, control transfers to block 60 which represents the DRAM interface 16 strobing the row identified in the row address with the row address strobe (RAS) for three clock cycles to setup and precharge the row address in the DRAM 2. Control transfers to block 62 which represents the DRAM interface 16 strobing the column identified in the column address with a column access strobe (CAS) for 1 clock cycle. Control transfers to block 64 which represents the data in the strobed column transferring from the DRAM 2 to the DRAM interface 16 via the DRAM data bus 26.

Block 66 is a decision block representing the DRAM interface 16 determining whether there are further columns in the paragraph at the accessed physical address. As discussed, in preferred embodiments, the DRAM interface 16 includes an address generator to generate the column addresses which the DRAM interface 16 uses to strobe all sixteen columns within the paragraph. The address generator uses a counter to generate column addresses within a paragraph until the counter value indicates that all columns within the paragraph have been accessed. If the counter value indicates there are further columns, control transfers to block 68; otherwise control transfers to block 70. Block 68 represents the DRAM interface 16 strobing the next column in the paragraph with a CAS for 1 clock cycle. From block 68, control transfers back to block 64 which represents the data in the strobed column being transferred from the DRAM 2 to the DRAM interface 16.

After all columns from the paragraph at the accessed physical address have been strobed and the data therein read out, control transfers to block 70 which represents the DRAM interface 16 strobing for one clock cycle the parity column in the parity paragraph associated with the paragraph just read. Control transfers to block 72 which represents the DRAM 2 transferring the parity code to the parity checker/generator 14 to check the paragraph read out of the DRAM 2 with the parity code. Control then transfers to block 74 which is a decision block representing the parity checker/generator 14 determining if there is a parity error in the paragraph just read out of the DRAM 2. If there is a parity error, control transfers to block 76; otherwise control transfers to block 78. Block 76 represents the DRAM controller 4 entering an error mode, such as ECC, to correct the parity error in a manner known in the art.

If there is no parity error, control transfers to block 78 which is a decision block representing the control logic 10 determining whether there are any further addresses in the read request stored in the LSR 12. If so, control transfers to block 80; otherwise control transfers to block 82. Block 80 represents the control logic 10 transferring all paragraphs read from the DRAM 2 to the data bus 3 via the bus interface 8 for transmittal to the requesting device. If there are further addresses to be read, control transfers to block 82 which represents the control logic 10 accessing the next requested physical address from the LSR 12 for the next paragraph to be read out of the DRAM 2. Control then transfers to block 84 which represents the control logic 10 passing the row and column addresses of the next accessed physical address to the DRAM interface 16.

Control transfers to block 86 which is a decision block representing the bus interface 16 determining whether the row of the accessed physical address is the same as the previously accessed row. If so, control transfers back to blocks 62 et seq. to strobe the columns in the paragraph at the next accessed physical address. Otherwise, control transfers back to blocks 60 et seq., wherein the DRAM interface 16 must strobe the next row in the DRAM 16 to setup and precharge such row before proceeding to strobe the columns in the next paragraph. With the extended page mode capabilities of the DRAM 2, the DRAM interface 16 need only perform RAS setup and precharge once for all data and parity paragraphs accessed within the same row. RAS setup and precharge is only performed when a paragraph is accessed which is located in a different row than the previously accessed paragraph. During access of paragraphs within a common row, the RAS signal remains active while the columns within the paragraphs are sequentially strobed.

FIG. 5 illustrates logic for writing data to the DRAM 2 in accordance with a preferred embodiment of the present invention. In preferred embodiments, the data bus 3 transmits data in data paragraphs along with an associated logical address of where to store the data paragraph. In the preferred embodiment of FIG. 1, the data paragraphs are written in the DRAM 2 contiguously in each row in paragraphs 0 through 29, wherein contiguous data paragraphs are interrupted only by parity code paragraphs 30 and 31.

Logic begins at block 90 which represents the DRAM controller 4 waiting for a write request from the data bus 3. Upon receiving such request, control transfers to block 92 which represents the bus interface 8 passing the write request, including the data paragraphs to be written, the logical addresses for each data paragraph, and control signals to the control logic 10. Control transfers to block 94, which represents the LSR 12 translating the logical addresses of the data paragraphs to be written to physical addresses and storing such translated physical addresses in the LSR 12.

Control then transfers to block 96 which represents the parity checker/generator 14 generating parity codes for each data paragraph to be written. Control transfers to block 98 which represents the bus interface 16 accessing the first data paragraph in the write request and the associated physical address stored in the LSR 12 where the first data paragraph will be stored. Control then transfers to block 100 which represents the control logic 10 passing the accessed data paragraph and associated physical address, comprising row and column addresses, to the DRAM interface 16. Control transfers to block 102 which represents the DRAM interface 16 strobing the row in the DRAM 2 identified by the transferred row address with a RAS strobe for three clock cycles to setup and precharge the row.

After setting up and precharging the row, control transfers to block 104 which represents the DRAM interface 16 strobing the column identified by the column address on the CAS line 22 for one clock cycle. Control transfers to block 106 which represents the bus interface 16 writing the first word (four bytes) in the accessed data paragraph to the strobed column via the DRAM data bus 26. After the first word in the accessed data paragraph is written to the DRAM 2, control transfers to block 108 which represents the DRAM interface 16 strobing the next column in the paragraph at the accessed physical address with the CAS line 22 for one clock cycle. After strobing, the next word in the accessed data paragraph is written to the strobed column.

Control then transfers to block 112, which is a decision block representing the bus interface 16 determining whether there is further unwritten data in the accessed data paragraph. If so, control transfers back to block 108 to write the next word from the accessed data paragraph to the next column in the DRAM 2; otherwise control transfers to block 114. As discussed, in preferred embodiments, the DRAM interface 16 includes an address generator to generate the addresses of the columns in the paragraph to strobe.

If all data from the accessed data paragraph has been written to the paragraph at the accessed physical address, control transfers to block 114, which represents the bus interface 16 strobing a parity column in the parity paragraph on the CAS line 22 for 1 clock cycle. This strobed parity column stores the parity code for the data paragraph just written in the DRAM 2. Control transfers to block 116, which represents the bus interface 16 writing the generated parity code in the strobed parity column via the DRAM data bus 26. Control then transfers to decision block 118, which represents the control logic 10 determining whether there are any further data paragraphs to write to the DRAM 2. If so, control transfers to block 122; otherwise, control transfers to block 120 which represents the completion of the write request.

If there are further data paragraphs to write to the DRAM 2, control transfers to block 122 which represents the control logic 10 accessing the next data paragraph and associated physical address stored in the LSR 12 where such data paragraph will be written. Control then transfers to block 124 which represents the control logic 10 passing the next data paragraph and associated physical address, comprising the next row and column addresses, to the DRAM interface 16.

Control transfers to block 126 which is a decision block representing the bus interface 16 determining whether the next row is the same as the previously accessed row. If so, control transfers back to block 104 and subsequent blocks to strobe all the columns in the paragraph at the accessed physical address. Otherwise, control transfers back to block 102, wherein the DRAM interface 16 must strobe the next row in the DRAM 16 with RAS to setup and precharge the next row prior to strobing the columns in the paragraph at the next physical address. As with the logic of FIG. 4, in FIG. 5, the DRAM interface 16 need only perform precharge and setup strobing once for all paragraphs and associated parity paragraphs accessed within the row. A row is only strobed when paragraphs in a different row are accessed.

Improved Timing for DRAM Accessing

The number of clock cycles required to access n paragraphs of data during a read or write access request can be calculated as follows. With the logic of FIGS. 4–5, it takes 20 clock cycles to access the first paragraph in a cluster of paragraphs included in a read/write request: three clock cycles for RAS setup and precharge; sixteen clock cycles to access each column within the paragraph at the accessed physical address; and one clock cycle to access the parity column. To access the remaining paragraphs in the row, it takes only seventeen clock cycles; sixteen clock cycles to access each column within the paragraph and one clock cycle to access the parity column associated with the accessed paragraph. By increasing the number of data paragraphs stored contiguously in the same row with the extended page mode discussed herein and by locating the parity codes in parity paragraphs at the end of the row, the logic described with respect to FIGS. 4 and 5 minimizes the number of clock cycles needed to access contiguous paragraphs of data stored in the DRAM 2.

In the preferred embodiments of FIGS. 1, 4, and 5, the average clock cycles to access n paragraph when $n \leq 30$ can be expressed by equation (1) as follows:

$$\frac{[20+17*(n-1)]}{n} = 17 + \frac{3}{n} \quad (1)$$

The average access cycle time when n>30 must account for the 3 clock cycles of RAS required to access the next row of paragraphs because in the embodiment of FIG. 1 there are only thirty data paragraphs per row. The average clock cycles to access a paragraph when n>30 can be expressed by equation (2) as follows, where INT represents the integer part of the value:

$$\frac{\left[\left(20+17*(30-1)*INT\left(\frac{n}{30}\right)\right)+(20+17*(n-30))\right]}{n} = \frac{\left[513*INT\left(\frac{n}{30}\right)+20+17*(n-30)\right]}{n} \quad (2)$$

The buffer bandwidth to transfer n paragraphs for a DRAM clock speed of C can be expressed by equations (3) and (4), as follows:

$$\left[\frac{C}{\left(17+\frac{3}{n}\right)}\right] * 64 \text{ MB/s}, \text{ when } n \leq 30. \quad (3)$$

$$\frac{C}{\left[513 * INT\left(\frac{n}{30}\right) + 20 + 17 * (n - 30)\right]} \times 64 \text{ MB/s}, \text{ when } n > 30. \quad (4)$$

Table 1, below, presents the calculated average access clock cycles and buffer bandwidths using the equations (1), (2), (3), and (4) with a DRAM clock speed (C) of 50 MHz.

| Number Paragraphs (n) | Average Access Cycle | Bandwidth (MB/s at 50 MHz) |
|---|---|---|
| 1 | 20.00 | 160.0 |
| 2 | 18.50 | 173.0 |
| 3 | 18.00 | 177.8 |
| 6 | 17.50 | 182.9 |
| 32 (1-sector) | 17.19 | 186.2 |
| 64 (2-sectors) | 17.14 | 186.7 |
| Infinite | 17.00 | 188.2 |

In present DRAM access schemes, the physical address must be translated for each paragraph access. This requires RAS clock cycles to setup and precharge the row for each paragraph access. When each paragraph access requires setup and precharge clock cycles, the minimum average paragraph access time is 20 clock cycles, 3 clock cycles to setup and precharge the row, 16 clock cycles to strobe each column in the paragraph, and 1 clock cycle to strobe the parity column. By performing all address translation with the LSR 12 and providing a longer active RAS with extended page mode, the preferred embodiments disclosed herein avoid the need to setup and precharge the row with each paragraph access. Moreover, the LSR 12 translation activities do not effect cycle access time because translation occurs during setup time or in parallel with other activities.

If the DRAM clock runs at 50 MHz, the buffer bandwidth for present schemes providing a twenty clock cycle average access time reaches 160 MB/s (50 MHz*20 cycles*64). With the logic of FIGS. 4 and 5, the buffer bandwidth reaches 188 MB/s. Thus, the present invention increases bandwidth without increasing the DRAM 2 clock rate.

Conclusion

This concludes the description of the preferred embodiments of the invention. The following describes some alternative embodiments for accomplishing the present invention.

Preferred embodiments are described with respect to a DRAM memory device. However, the memory access scheme of the preferred embodiments may apply to different types of DRAM chips, such as DIPs, SIMMs, and SIPs or alternative memory devices, such as an SRAM memory unit. Further, the access scheme of the present invention is described with respect to a 256 K×16 DRAM utilizing extended page mode. However, those skilled in the art will recognize that the access scheme of the present invention may apply to DRAMs of different sizes (512 K, 1 Mb, etc.) utilizing different page mode systems (e.g., normal page mode RAM, Fast Page Mode RAM, Extended Data Output RAM, synchronous DRAM (SDRAM), etc.)

Preferred embodiments are described with respect to an extended page mode memory arrangement having thirty-two paragraphs of data per row. This memory arrangement is intended to maximize the number of contiguous data paragraphs to speed up memory access. Notwithstanding, the present invention may apply to memory arrangements having a row/column arrangement different than the arrangement described with respect to FIG. 1, i.e., data addressed in sixty-four byte paragraphs, with thirty data paragraphs and two parity paragraphs per row. For instance, data may be addressed in paragraphs having a length different than sixty-four bytes and/or each row may contain a number of paragraphs different than thirty-two.

The block diagram of FIG. 2 is intended for illustrative purposes only to generally describe the functions performed by the DRAM controller 4. Those skilled in the art will recognize that functions performed by the DRAM controller 4 as described with reference to FIG. 2 may be carried out in a manner different from that described above. Further, the components of the DRAM controller 4, including the bus interface 8, control logic 10, LSR 12, parity checker/generator 14, and DRAM Interface 16, may be implemented with hardware logic (e.g., gates and circuits), firmware or a combination thereof. Still further, certain of the components of the DRAM controller 4 may be implemented in hardware and firmware logic located in circuit components external to the DRAM controller 4.

Moreover, events may occur at times different than the times described above. For instance, parity checking or generation may occur in a manner different than that described above. A parity code may be generated continuously while data is being transferred to the DRAM interface 16 as opposed to the parity codes being generated all at once before transfer during set-up. Moreover, the LSR 12 may translate logical to physical addresses at a time other than during set-up operations.

In summary, the present invention discloses a DRAM having a plurality of rows, wherein each row has a plurality of DRAM paragraphs comprised of a plurality of contiguous columns. A linear shift register (LSR) translates a plurality of logical addresses to corresponding physical address locations in the DRAM. Each translated physical address is comprised of a row address and a column address. A physical address, including the row and column addresses, is accessed from the LSR. To access the DRAM paragraph at the accessed physical address, the row in the DRAM at the accessed row address location is strobed to setup and precharge the row. Following, all columns in the DRAM paragraph at the accessed physical address are strobed.

After strobing the columns in a DRAM paragraph, the next physical address in the LSR, including the next row and column addresses, is accessed. The row in the DRAM at the next accessed row address is strobed to setup and precharge the row upon determining that the next row address is different than the previously accessed row address. All columns in the DRAM paragraph at the accessed physical address are strobed.

The foregoing description of the preferred embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method for accessing a memory device, wherein the memory device has a plurality of row locations, wherein each row has a plurality of paragraph locations comprised of a plurality of contiguous columns for storing data, comprising the steps of:

(a) translating a plurality of logical addresses with a linear shift register (LSR) to corresponding physical address locations in the memory device, wherein each translated physical address is comprised of a row address and a column address; and (b) accessing the translated physical address locations in the memory device.

2. The method of claim 1, wherein the step of accessing the translated physical address locations in the memory device further comprises the steps of:

(a) accessing a physical address, including the row and column addresses, from the LSR;

(b) strobing the row in the memory device at the accessed row address location to setup and precharge the row;

(c) strobing all columns in the paragraph location at the accessed physical address;

(d) accessing a next physical address in the LSR, including a next row and column addresses;

(e) strobing the row location at the next accessed row address to setup and precharge the row location upon determining that the next row address is different than the previously accessed row address; and (f) strobing all columns in the paragraph location at the accessed physical address.

3. The method of claim 2, further including the step of reading data from the strobed columns.

4. The method of claim 2, wherein for a translated physical address there is an associated data paragraph comprised of data, further including the step of writing the data in the data paragraph to the strobed columns in the paragraph location at the associated physical address.

5. The method of claim 4, further comprising the steps of:

generating a parity code for a data paragraph;

after writing the data in a data paragraph to the memory device, strobing a parity location column in the memory device; and writing the parity code to the parity location column.

6. The method of claim 5, wherein the parity code is written in the row where the data paragraph for which the parity code was generated is stored.

7. The method of claim 6, wherein a plurality of data paragraphs are written in a row and wherein the parity codes generated for the written data paragraphs are stored in the columns following the written data paragraphs.

8. The method of claim 7, wherein there are thirty-two paragraph locations in each row in the memory device, wherein each paragraph location comprises sixty-four bytes, and wherein each row includes thirty contiguous paragraph locations for storing data followed by two paragraphs storing the parity codes generated for the thirty paragraphs storing data.

9. The method of claim 1, wherein the LSR translates the logical addresses to physical addresses before any of the physical addresses in the memory device are accessed.

10. The method of claim 1, wherein the LSR translates a logical address to a physical address by dividing the logical address by a fixed divider polynomial, wherein a quotient of the dividing is the physical row address and a remainder of the dividing is the physical column address.

11. The method of claim 10, wherein the fixed divider polynomial is $x^4+x^3+x^2+x$.

12. The method of claim 10, wherein the fixed divider polynomial is $x^5+x^4+x^3+x^2$.

13. An apparatus for accessing a memory device, wherein the memory device has a plurality of row locations, wherein each row has a plurality of paragraph locations comprised of a plurality of contiguous columns, comprising:

(a) a linear shift register (LSR) for translating a plurality of logical addresses to corresponding physical address locations in the memory device, wherein each translated physical address is comprised of a row address and a column address; and (b) means for accessing the translated physical address locations in the memory device.

14. The apparatus of claim 13, wherein the means for accessing the translated physical address locations in the memory device comprises:

(a) a row access strobe (RAS);

(b) a column access strobe (CAS);

(c) logic for causing the RAS to strobe the row in the memory device at the accessed row address location to setup and precharge the row;

(d) logic for causing the CAS to strobe all columns in the paragraph location at the accessed physical address;

(e) logic for accessing a next physical address in the LSR, including a next row and column addresses;

(f) logic for determining whether the next row address is the same as the row address in the previously accessed physical address; and (g) logic for strobing the row in the memory device at the next row address to setup and precharge the row upon determining that the next row address is different than the row address already setup and precharged.

15. The apparatus of claim 14, further including logic for reading data from the strobed columns.

16. The apparatus of claim 14, wherein for a translated physical address there is an associated data paragraph comprised of data, further including logic for writing the data in the data paragraph to the strobed columns in the paragraph location at the associated physical address.

17. The apparatus of claim 16, further comprising means for generating a parity code for a data paragraph and means for writing the parity code to the parity location column.

18. The apparatus of claim 17, wherein the parity code is written in the row where the data in the data paragraph for which the parity code was generated is stored.

19. The apparatus of claim 18, wherein a plurality of data paragraphs are written in a row and wherein the parity codes generated for such written data paragraphs are stored in the columns following such written data paragraphs.

20. The apparatus of claim 19, wherein there are thirty-two paragraph locations in each row in the memory device, wherein each paragraph location comprises sixty four bytes, and wherein each row includes thirty contiguous paragraph locations for storing data followed by two paragraphs storing the parity codes generated for the thirty paragraphs storing data.

21. The apparatus of claim 13, wherein the LSR translates the logical addresses to physical addresses before any of the physical addresses in the memory device are accessed.

22. The apparatus of claim 13, wherein the LSR translates a logical address to a physical address by dividing the logical address by a fixed divider polynomial, wherein a quotient of the dividing is the physical row address and a remainder of the dividing is the physical column address.

23. The apparatus of claim 22, wherein the LSR is implemented as the logic equation $x^4+x^3+x^2+x$.

24. The apparatus of claim 22, wherein the LSR is implemented as the logic equation $x^5+x^4+x^3+x^2$.

25. A memory access system, comprising:
  (a) a DRAM, wherein the DRAM has a plurality of rows, wherein each row has a plurality of DRAM paragraphs comprised of a plurality of contiguous columns, comprising the steps of:
  (b) a linear shift register (LSR) for translating a plurality of logical addresses to corresponding physical address locations in the DRAM, wherein each translated physical address is comprised of a row address and a column address;
  (c) a row access strobe (RAS);
  (d) a column access strobe (CAS);
  (e) logic for accessing a translated physical address;
  (f) logic for causing the RAS to strobe a row in the DRAM at a row address location of the accessed physical address to setup and precharge the row;
  (g) logic for causing the CAS to strobe all columns in the DRAM paragraph at the accessed physical address;
  (h) logic for accessing a next physical address in the LSR, including a next row and column addresses;
  (i) logic for determining whether the next row address is the same as the row address in the previously accessed physical address; and
  (j) logic for strobing the row in the DRAM at the next row address to setup and precharge the row upon determining that the next row address is different than the row address already setup and precharged.

* * * * *

UNITED STATES PATENT AND TRADEMARK OFFICE
CERTIFICATE OF CORRECTION

PATENT NO.   : 6,148,388
DATED        : November 14, 2000
INVENTOR(S)  : Frank Yuhhaw Wu and Steven K. Peng It is certified that error appears in the above-identified patent and that said Letters Patent is hereby corrected as shown below:

<u>Title page,</u>
Item [75], Inventors, delete "Feng" and replace with -- Peng --

Signed and Sealed this

Twentieth Day of May, 2003

JAMES E. ROGAN
*Director of the United States Patent and Trademark Office*